(12) United States Patent
Guth et al.

(10) Patent No.: US 7,555,832 B2
(45) Date of Patent: Jul. 7, 2009

(54) SEMICONDUCTOR CHIP ATTACHMENT

(75) Inventors: Karsten Guth, Soest (DE); Roland Speckels, Kamen (DE); Alfred Kemper, Warstein (DE)

(73) Assignee: Infineon Technologies AG, Munich (DE)

( * ) Notice: Subject to any disclaimer, the term of this patent is extended or adjusted under 35 U.S.C. 154(b) by 66 days.

(21) Appl. No.: 11/688,057

(22) Filed: Mar. 19, 2007

(65) Prior Publication Data

US 2008/0229575 A1    Sep. 25, 2008

(51) Int. Cl.
*B23P 19/00* (2006.01)

(52) U.S. Cl. .............................. 29/740; 29/739; 29/741
(58) Field of Classification Search ............ 29/739–741
See application file for complete search history.

(56) References Cited

U.S. PATENT DOCUMENTS

| 3,499,203 | A | * | 3/1970 | Clarke et al. ................... 29/710 |
| 4,805,110 | A | * | 2/1989 | Takahashi et al. ............ 700/121 |
| 5,084,962 | A | * | 2/1992 | Takahashi et al. ............. 29/833 |
| 6,016,949 | A | * | 1/2000 | Slesinger ............... 228/180.22 |

* cited by examiner

*Primary Examiner*—C. J Arbes
(74) *Attorney, Agent, or Firm*—Coats & Bennett, P.L.L.C.

(57) ABSTRACT

A chip carrier member comprises a rotatable chip-receiving element. The rotatable chip-receiving element is rotatable essentially about a point.

24 Claims, 5 Drawing Sheets

SEMICONDUCTOR CHIP ATTACHMENT

TECHNOLOGY FIELD

The present invention relates to an attachment of a semiconductor chip onto a substrate.

BACKGROUND

A semiconductor chip is typically mounted onto a substrate for dissipation of heat away from the operational semiconductor chip. The semiconductor chip comprises electrical circuits and contact pads that are connected to the electrical circuit. The contact pads may be connected to external contact pads that are on the substrate by electrical wires.

SUMMARY

A chip carrier member is presented that comprises a rotatable chip-receiving element, the rotatable chip-receiving element being rotatable essentially about a point.

A method of attaching a semiconductor chip onto a substrate comprises the steps of providing a substrate; providing a semiconductor chip on the substrate via a layer of adhesive, the layer of adhesive being adjacent to the layer of adhesive or solder; providing a rotatable chip-receiving element on the semiconductor chip; and applying a force on a surface of the semiconductor chip via the rotatable chip-receiving element that allows the semiconductor chip to essentially rotate about a point with essentially no translational movement.

BRIEF DESCRIPTION OF THE DRAWINGS

The invention can be better understood with reference to the following drawings and description. The components in the figures are not necessarily to scale. Instead, emphasis is being placed upon illustrating the principles of the invention. Moreover, in the figures, like reference numerals designate corresponding parts. In the drawings.

DETAILED DESCRIPTION

Figure 1:
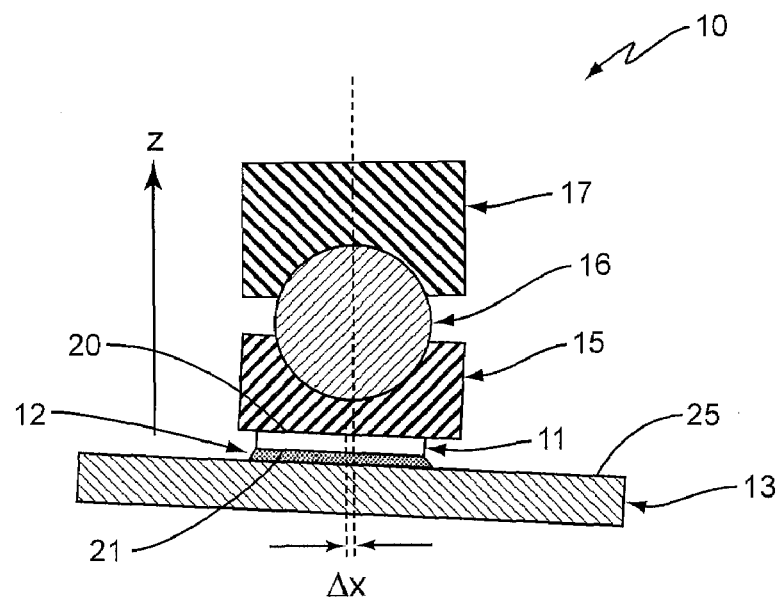
FIG. 1 is a cross-sectional view of a pick-up arm with a ball and socket type of joint for rotation about a point.

FIG. 1 illustrates in a cross-sectional view an example of a pick-up arm 10 carrying a semiconductor chip 11 to be adhered to a substrate 13 through a layer of adhesive 12 or (soft) solder. Before placing the semiconductor chip onto the substrate, the layer of adhesive or solder may be applied first to the chip or alternatively to the substrate. In particular, solder may be applied by means of diffusion soldering. In the following, for the sake of simplicity, only adhesive is mentioned although solder is applicable as well. The layer of adhesive 12 is arranged on the substrate 13 and the semiconductor chip 11 is provided on the layer of adhesive 12. The pick-up arm 10 is placed on the semiconductor chip 11. The layer of adhesive 12 is adjacent to both the substrate 13 and the semiconductor chip 11 whilst the pick-up arm 10 is adjacent to the semiconductor chip 11.

The pick-up arm 10 comprises a collet 15, a ball 16, and a rod 17. The rod 17 is connected to the ball 16 that is placed below the rod 17 whilst the ball 16 is connected to the collet 15 that is provided below the ball 16. The collet 15 may be made from steel, brass, plastic or other materials. The semiconductor chip 11 comprises an active surface 20 and a passive surface 21 opposite to the active surface 20. The active surface 20 of the semiconductor 11 is adjacent to a bottom surface of the collet 15. The substrate 13 includes an upper surface 25 over which the semiconductor chip 11 is placed. In the example shown in FIG. 1, the pick-up arm 10 is aligned in vertical direction (z). The substrate 13 has a slight tilt $\Delta x$ with regard to the semiconductor chip 11.

The pick-up arm 10 of FIG. 1 forms a chip carrier member. The chip carrier member comprises a rotatable chip-receiving member in the form of the collet 15. The rod 17 serves as a support element. Accordingly, the chip carrier member provides an even force over the semiconductor chip 11 towards the substrate 13. The chip carrier member essentially moves in rotational manner during the application of force onto the semiconductor chip 11. The substrate 13 provides a platform for securing the semiconductor chip 11 and a means for dissipating heat generated by the operational semiconductor chip 11. The layer of adhesive 12 attaches the semiconductor chip 11 onto the substrate 13 and acts as a passageway for transference of heat from the semiconductor chip 11 into the substrate 13. The pick-up arm 10 is part of a chip-attachment machine that provides automated movement of the semiconductor chip 11 from a sawn wafer onto the substrate 13 and placement of the semiconductor chip 11 onto the substrate 13. The sawn wafer includes a plurality of semiconductor chips of the type of chip 11 that are separated from each other.

The collet 15 is for engaging with the semiconductor chip 11 and is connected by the rod 17 to further parts (not shown) of a chip-attachment machine. The ball 16 and the collet 15 form a ball and socket type of joint for rotation about a point. The ball and socket type of joint is a form of a swivel type of joint that turns about a point. The swivel type of joint is also a form of cardanic type of joint that comprises two hinges connected at a right angle to each other. A form of a rotation about a point includes also a rotation about a line. A hinge type of joint is an example of a rotation about a line.

An exemplary method of attaching the semiconductor chip 11 onto the substrate 13 using the pick-up arm 10 shown in FIG. 1 comprises the steps of providing the substrate 13 and then placing the layer of adhesive 12 on the upper surface 25 of the substrate 13. Then, the pick-up arm 10 transports the semiconductor chip 11 from the sawn wafer and places the semiconductor chip 11 onto the layer of adhesive 12. The layer of adhesive 12 wets the passive surface 21 of the semiconductor chip 11. Following this, the first pick-up arm 10 exerts a force onto the semiconductor chip 11 in a direction that is towards the substrate 13. The application of the force by the pick-up arm 10 onto the semiconductor chip 11 is even across the surface of the semiconductor chip 11.

The force may cause the collet 15 of the pick-up arm 10 to rotate essentially about a point to compensate for any tilt between the semiconductor chip 11 and the substrate 13. The essentially rotational movement is such that the collet 15 moves in a rotational manner about a point around the ball 16 and may additionally translational in a line. The translation along the line is due to elastically deformation of the parts of the pick-arm 10 such as the ball 16 when the force is exerted onto the semiconductor chip 11.

Thereby, the thickness of the adhesive 12 that is between the passive surface 21 of the semiconductor chip 11 and the upper surface 25 of the substrate 13 is essentially even. However, the surface of the semiconductor chip 11 may have a slightly uneven contours resulting from the formation of electrical circuits on the surface so that the thickness of the adhesive 12 also may have a slightly uneven thickness. The thickness of the adhesive 12 is about 10 μm (micrometer) or less. The semiconductor chip 11 that is attached to the substrate 13 is now ready for the next step of semiconductor package assembly.

The method of FIG. 1 provides a simple way of attaching the semiconductor chip 11 onto the substrate 13 via the adhesive 12 such that the adhesive 12 has an essentially even thickness. The essentially even thickness provides an even dissipation of heat across the surface of the operational semiconductor chip 11. An uneven dissipation of heat may promote delamination of the semiconductor chip 11 from the substrate 13. The essentially even thickness of the adhesive 12 is of particular importance when the thickness of the adhesive 12 is little.

Figures 2, 3:
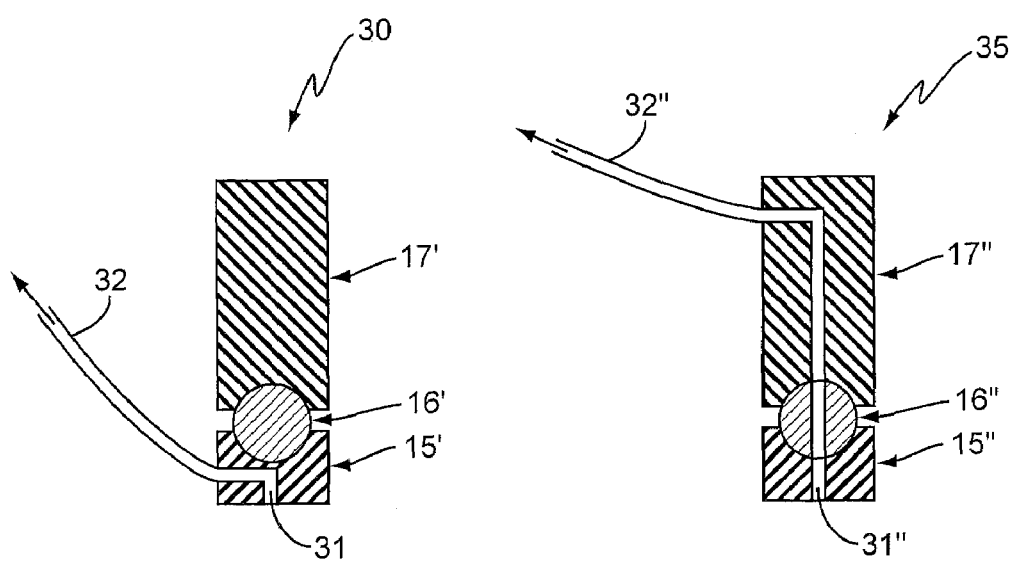
FIG. 2 is a cross-sectional view of a pick-up arm comprising a passageway.
FIG. 3 is a cross-sectional view of another pick-up arm comprising a passageway.

FIG. 2 is a cross-sectional view of another example of a pick-up arm 30. The example shown in FIG. 2 is similar to that shown in FIG. 1. The pick-up arm 30, too, comprises a collet 15', a ball 16' and a rod 17'. The rod 17' is connected to the ball 16', which is placed beneath the rod 17' whilst the ball 16' is connected to the collet 15' that is provided below the ball 16'. The collet 15' comprises a passageway 31 that is provided within the collet 15'. The passageway 31 comprises a first end that is arranged on a bottom surface of the collet 15' and a second end that is arranged on a side surface of the collet 15'. A tube 32 is connected to the second end of the passage 31. The passageway 31 used in the example of FIG. 2 is a vacuum suction channel. Compared to the example of FIG. 1, the pick-up arm 30 of FIG. 2 provides a channel in the form of tube 32 wherein passageway 31 connects a vacuum suction machine to a semiconductor chip that is placed below the collet 15'.

An exemplary of a method of attaching a semiconductor chip onto a substrate using the pick-up arm 30 of FIG. 1 comprises the steps of providing the substrate and placing a layer of adhesive on the substrate. Then, the pick-up arm 30 is placed on a semiconductor chip of a sawn wafer. The bottom surface of the collet 15' is in contact with a surface of the semiconductor chip. After this, a vacuum is essentially generated in the passageway 31 by the vacuum suction machine. This attaches the semiconductor chip onto the collet 15'.

Following this, the pick-up arm 30 takes the semiconductor chip from the sawn wafer and places the semiconductor chip on the layer of adhesive. The pick-up arm 30 then exerts an even force on the semiconductor chip towards the substrate. At this point, the vacuum suction machine ceases generating the vacuum in the passageway 31. The semiconductor chip does not shift as the second pick-up arm 30 is exerting the force onto the semiconductor chip. The pick-up arm 30 stops exerting the force onto the semiconductor chip and moves away from the semiconductor chip. Compared to the method described above, the present method uses vacuum suction to attach the semiconductor chip onto the collet 15'.

FIG. 3 is a cross-sectional view of another example of a pick-up arm 35. The pick-up arm 35 comprises a collet 15", a ball 16" and a rod 17". A passageway 31" extends within the collet 15", the ball 16" and the rod 17". The passageway 31" comprises a first end and a second end. The first end is located on a bottom surface of the collet 15" whilst the second end is located on a side surface of the rod 17". A tube 32" is connected to the second end of the passage 31". The example shown in FIG. 3 provides a different channel compared to the example of FIG. 2. The channel is again a tube 32" being part of the passageway 31" between a vacuum machine and a semiconductor chip. The weight of the tube 32" does not exert a tilting force onto the collet 15" as tube 32" is not connected to the collet 15". A weight of a tube that is attached to the collet 15" may exert a tilting force onto the collet 15". The tilting force may change the thickness of an adhesive that is provided between the semiconductor chip and the substrate during the attachment of the semiconductor chip to the substrate.

An method of attaching a semiconductor chip onto a substrate using the pick-up arm 35 shown in FIG. 3 is similar to the methods described above in connection with FIGS. 1 and 2. The features and advantages of these examples apply to the present example accordingly.

Figure 4:
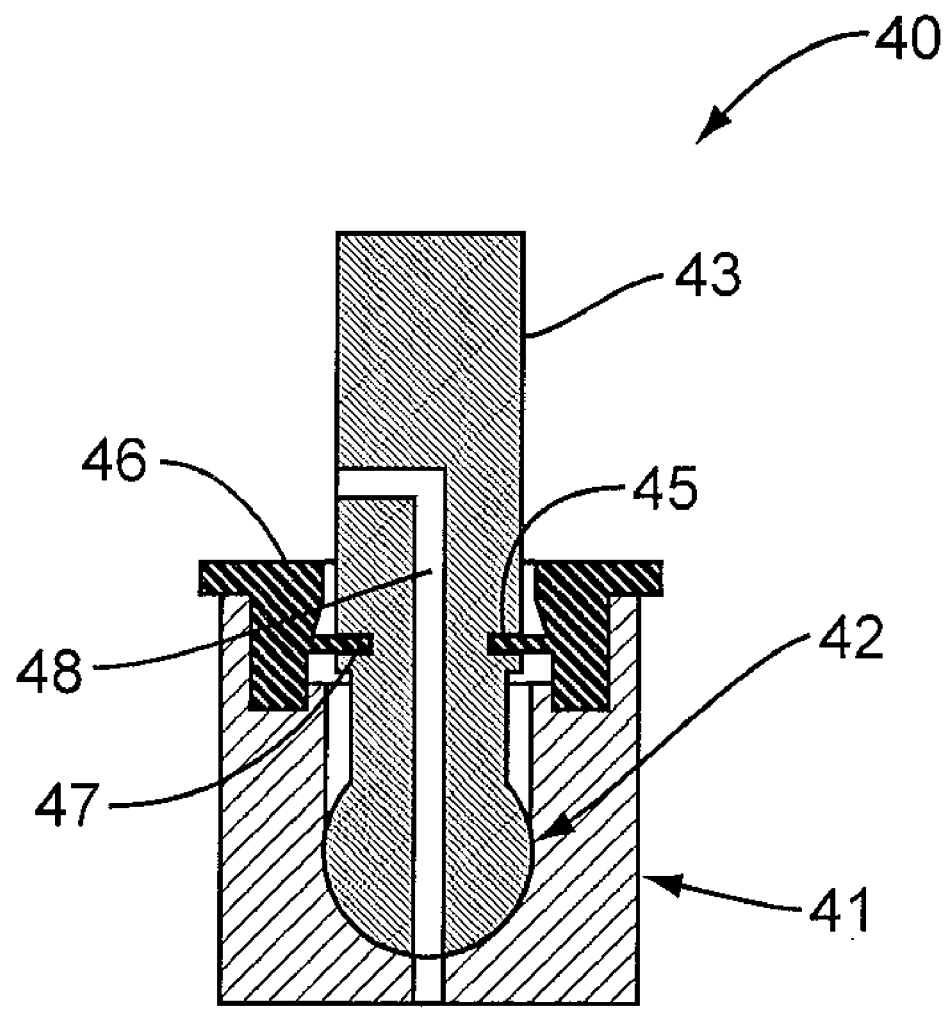
FIG. 4 is a cross-sectional view of a pick-up arm comprising a groove and a diaphragm.

FIG. 4 is a cross-sectional view of a pick-up arm 40. The pick-up arm 40 includes a collet 41, a ball 42 and a rod 43. The ball 42 is arranged inside and in contact with the collet 41, and is connected to the rod 43. The rod 43 comprises a groove 45 and a diaphragm 46 with protrusions 47. The diaphragm 46 is provided in a gap arranged between the collet 41 and the rod 43. The protrusions 47 of the diaphragm 46 are located inside the groove 45 of the rod 43. A passageway 48 extends within the collet 41, the ball 42 and the rod 43. The passageway 48 comprises a first end placed on a bottom surface of the collet 41 and a second end placed on a side surface of the rod 43. In the example of FIG. 4, a sealing means, in the form of a diaphragm 46, for the gap that is between the collet 41 and the rod 43. The diaphragm 46 comprises protrusions 47 that are arranged within the groove 45. The protrusions 47 and the groove 45 allow the ball 42 to rotate essentially about a point while maintaining the seal provided by the diaphragm 46.

An method of attaching a semiconductor chip onto a substrate using the pick-up arm 35 shown in FIG. 4 is similar to the method described above in connection with FIG. 3. The features and advantages of this example apply to the present example accordingly.

Figure 5:
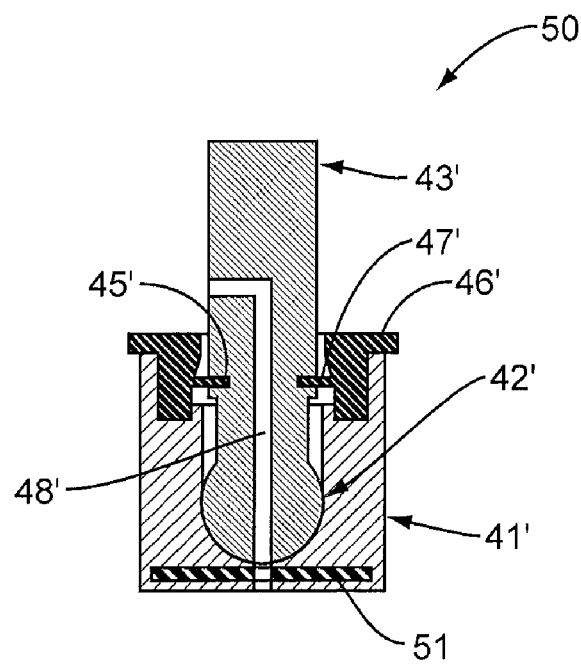
FIG. 5 is a cross-sectional view of a pick-up arm comprising a heating plate.

FIG. 5 is a cross-sectional view of another exemplary pick-up arm 50. The pick-up arm 50 comprises a collet 41', a ball 42' and a rod 43'. The ball 42' is arranged inside the collet 41' wherein the ball 42' is attached to the rod 43'. The collet 41' includes a heating plate 51 and comprises a thermal conductive material such as metal for providing a low thermal resistance between the heating plate 51 and the ambient air around the collet 41'. The rod 43' comprises a groove 45' and a diaphragm 46' with protrusions 47'. A passageway 48' extends within the collet 41', the ball 42' and the rod 43'. The heating plate 51 may be a kind of heating element. The heating plate 51 heats an adhesive that is placed between a semiconductor chip and a substrate. The heating plate 51 may be provided in addition to or as an alternative for an oven commonly used to heat the adhesive.

An exemplary method of attaching a semiconductor chip onto a substrate using the pick-up arm 50 of FIG. 5 comprises the step of providing a substrate. Following this, a layer of molten adhesive is placed on the substrate. The molten adhesive is of the type that hardens when heated. Then, the pick-up arm 50 takes the semiconductor chip from a sawn wafer and places the semiconductor chip onto the layer of adhesive exerting an even force on the semiconductor chip towards the substrate. After this, the heating plate 51 is energised for a period, e.g., by applying electrical current. The heat from the heating plate 51 hardens the adhesive. The pick-up arm then releases the force onto the semiconductor chip and is turned away from the semiconductor chip.

Figure 6:
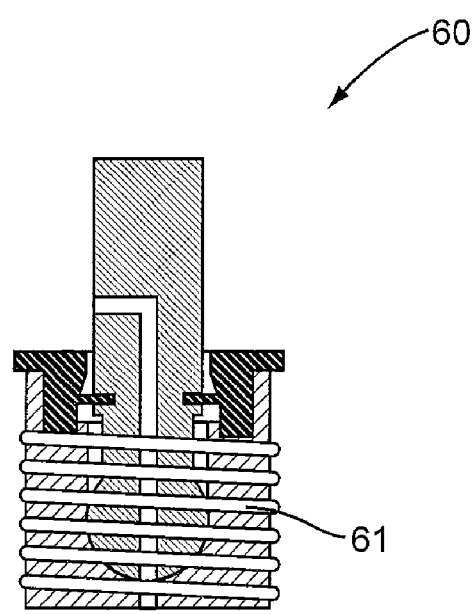
FIG. 6 is a cross-sectional view of a pick-up arm having an additional, coil-like heating element.

FIG. 6 is a cross-sectional view of a pick-up arm 60. Pick-up arm 60 is similar to pick-up arm 50 of FIG. 5. The features and advantages of these examples apply to the present example as well. However, the arrangement shown in FIG. 6 includes an additional heating element 61 to heat an adhesive that is placed between a semiconductor chip and a substrate. Heating element 61 has a tubular shape and is wound like a coil around the collet 41'. The heating element may generate heat by way of electrical current flowing through resistor elements within the tube of the heating element or by way of an heated fluid flowing through the tube itself. Accordingly, a method of attaching a semiconductor chip onto a substrate using the pick-up arm 60 of FIG. 6 is similar to the method using the pick-up arm 50 shown in FIG. 5 wherein additional heat is generated by the heating element 61.

Figure 7:
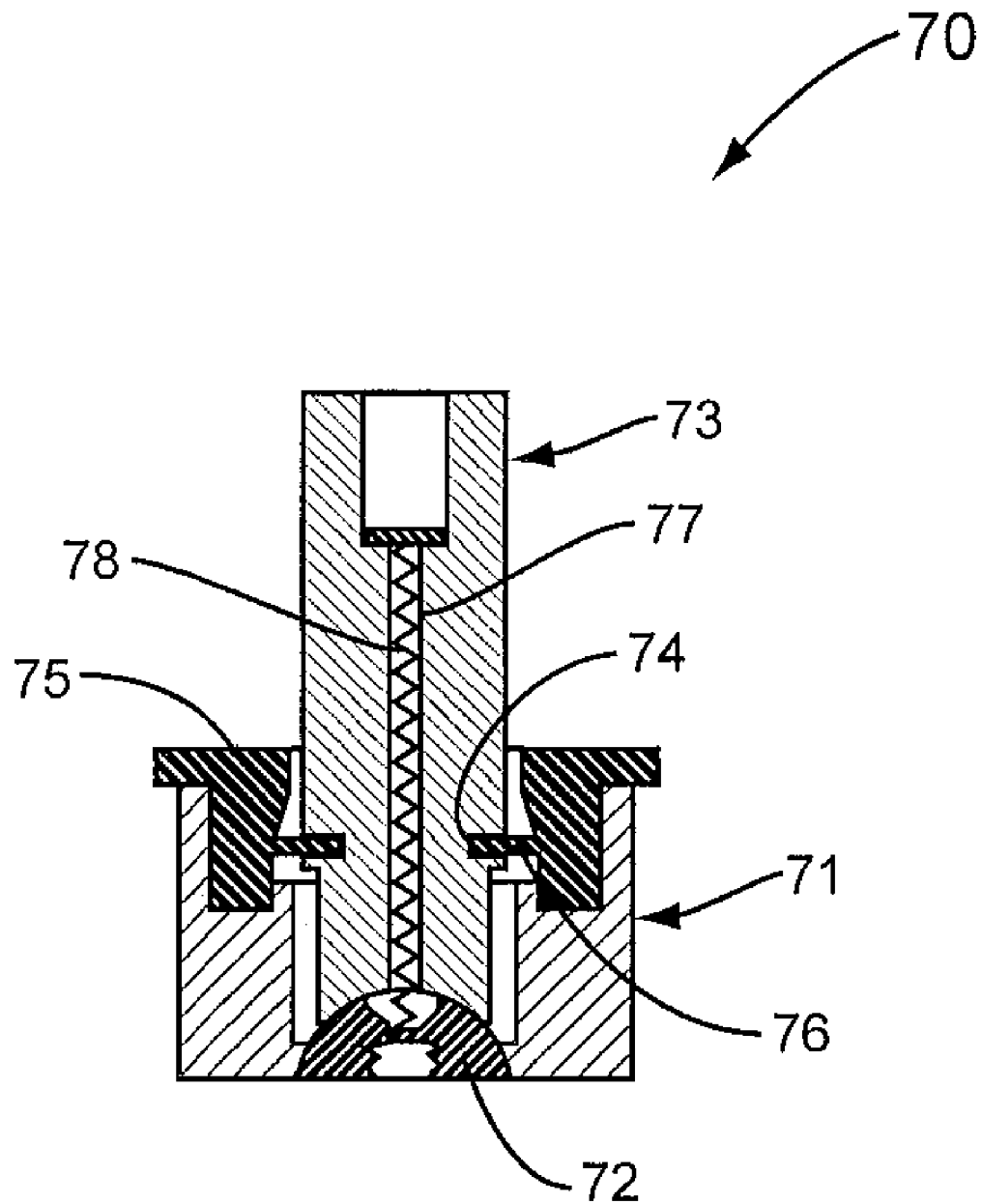
FIG. 7 is a cross-sectional view of a pick-up arm comprising a spring.

FIG. 7 is a cross-sectional view of a pick-up arm 70 which includes a collet 71 and a rod 73. Pick-up arm 70 is similar to pick-up arm 50 of FIG. 5 wherein the collet 71 substitutes the collet 41' of FIG. 5 and the rod 73 substitutes to the rod 43' of FIG. 5. The rod 73 comprises a semi-spherical flange 72, a groove 74, a diaphragm 75 with protrusions 76, and a hollow channel 77. The semi-spherical flange 72 is adjacent to the rod 73 and has a flat bottom surface facing downwards. The diaphragm 75 is arranged in a gap that is located between the rod 73 and the collet 71. Groove 74 substitutes groove 45' of FIG. 5, diaphragm 75 substitutes diaphragm 46' of FIG. 5, and protrusions 76 substitute protrusions 47' of FIG. 5. A spring 78 comprising a first end and a second end is placed in the hollow channel 77. The first end of the spring 78 is attached to a top portion of the rod 73 and the second end of the spring is attached to the semi-spherical flange 72.

Thus, the arrangement of FIG. 7 comprises a rotatable chip-receiving element in the form of the semi-spherical flange 72 that rotates about a point that is adjacent to the bottom surface of the semi-spherical flange 72. The bottom surface is for electrically contacting a semiconductor chip. The rotation does not generate a shifting force on the semiconductor. This differs from a rotation about a point that is outside the bottom surface of the semi-spherical flange 72 in which the rotation generates a shifting force on the semiconductor chip. The semi-spherical flange 72 is adapted for engaging with the semiconductor chip. The flat surface of the semi-spherical flange 72 engages with the semiconductor chip. The spring 78 is for keeping the semi-spherical flange 72 attached to the rod 73. The way a semiconductor chip is attached onto a substrate using the pick-up arm 70 of FIG. 7 is similar to the method using the pick-up arm 60 of FIG. 6.

Figure 8:
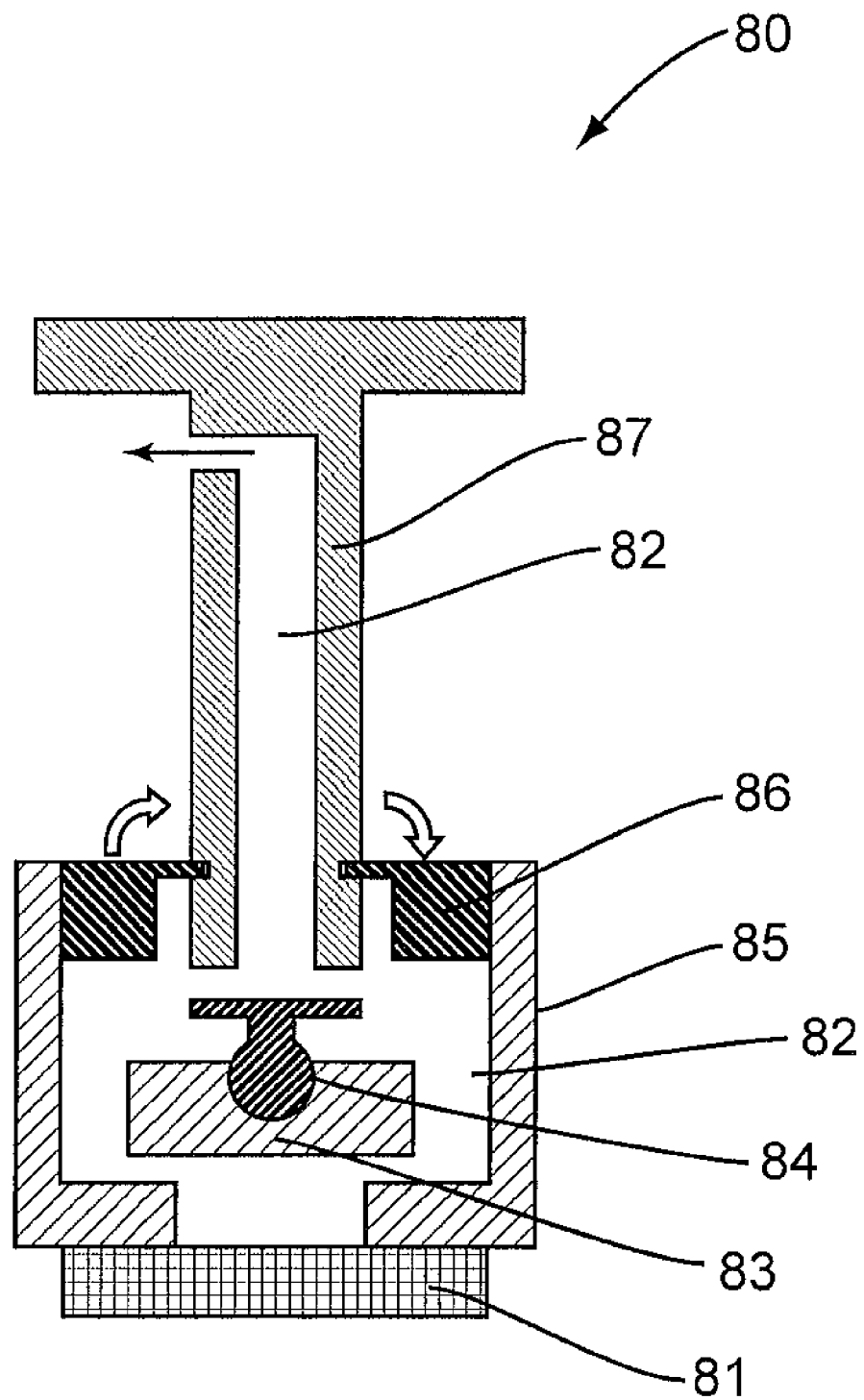
FIG. 8 is a cross-sectional view of another pick-up arm comprising a passageway and a ball and socket type of joint for rotation about a point.

FIG. 8 is a cross-sectional view of another pick-up arm 80 comprising a collet 85, a rod 87, and a ball 84 attached to the rod 87. A passageway 82 extends within the rod 87 and the collet 85 but not within the ball 84. Instead, the passageway 82 leads air around the ball 84 which is rested in a groove 83 of the collet 85. The passageway 82 comprises a first end and a second end where the first end is located on a bottom surface of the collet 85 and the second end is located on a side surface of the rod 87. The passageway 82 connects a vacuum machine (not shown) to a semiconductor chip 81. In order to get the connection between the collet 85 and the rod 87 sealed, a diaphragm 86 is arranged between and connected to the lower end of the rod 87 and the upper end of collet 85.

Although various examples of the present invention have been described herein above in detail, it is desired, to emphasis that this has been for the purpose of illustrating the present invention and should not be considered as necessarily limitative of the invention, it being understood that many modifications and variations can be made by those skilled in the art while still practising the invention claimed herein.

What is claimed is:

1. A chip carrier member, comprising:
   a rotatable chip-receiving element having a surface configured to engage a semiconductor chip;
   an unpowered joint configured to connect the rotatable chip-receiving element to a support element of a chip attachment machine; and
   wherein the unpowered joint provides the rotatable chip-receiving element with a plurality of rotational degrees of freedom relative to the support element when the rotatable chip-receiving element engages the semiconductor chip.

2. The chip carrier member of claim 1 further comprising a vacuum suction channel where the vacuum suction channel comprises a first end and a second end and the first end is connected to the surface of the rotatable chip-receiving element.

3. The chip carrier member of claim 2 where the second end is connected to a side surface of the rotatable chip-receiving element.

4. The chip carrier member of claim 2 where the second end is connected to surface of the support element.

5. The chip carrier member of claim 4 where the vacuum suction channel extends through the unpowered joint.

6. A chip carrier member of claim 5 where the unpowered joint is a cardanic type joint.

7. A chip carrier member of claim 5 where the unpowered joint is a swivel type joint.

8. A chip carrier member of claim 5 where the unpowered joint is a ball and socket type joint.

9. A chip carrier member of claim 5 where the unpowered joint enables the rotatable chip-receiving element to rotate about a line relative to the support element when the rotatable chip-receiving element engages the semiconductor chip.

10. A chip carrier member of claim 9 where the unpowered joint is of a hinge type joint.

11. The chip carrier member of claim 1 where the rotatable chip-receiving element comprises a heating element.

12. The chip carrier member of claim 11 where the heating element is a heating plate.

13. The chip carrier member of claim 11 where the heating element is a heating coil.

14. The chip carrier member of claim 1 where the rotatable chip-receiving element is configured to rotate about a point outside the surface of the rotatable chip-receiving element.

15. The chip carrier member of claim 1 where the rotatable chip-receiving element is configured to rotate about a point adjacent to the surface of the rotatable chip-receiving element.

16. The chip carrier member of claim 15 wherein the rotatable chip-receiving element comprises a semi-spherical flange, a flat bottom surface of the semi-spherical flange being in contact with the semiconductor chip.

17. The chip carrier member of claim 16 further comprises a spring, the spring being in contact with the semi-spherical flange and the support element.

18. The chip carrier member of claim 1, wherein the unpowered joint comprises an at least partially spherical element connected to the rotatable chip-receiving element.

19. The chip carrier member of claim 18, wherein the rotatable chip-receiving element comprises a collet and the at least partially spherical element comprises a ball.

20. The chip carrier member of claim 1, further comprising a diaphragm arranged adjacent an inner wall of the rotatable chip-receiving element configured to maintain a seal between the rotatable chip-receiving element and the support element.

21. A chip attachment machine, comprising:
- a support element;
- a rotatable chip-receiving element having a surface configured to engage a semiconductor chip;
- an unpowered joint which connects the rotatable chip-receiving element to the support element; and
- wherein the unpowered joint provides the rotatable chip-receiving element with a plurality of rotational degrees of freedom relative to the support element when the rotatable chip-receiving element engages the semiconductor chip.

22. The chip attachment machine of claim 21 where the rotatable chip-receiving element comprises a vacuum suction channel where the vacuum suction channel comprises a first end and a second end and the first end is connected to the surface of the rotatable chip-receiving element.

23. The chip attachment machine of claim 21 where the rotatable chip-receiving element comprises a heating element.

24. The chip attachment machine of claim 21 where the rotatable chip-receiving element rotates is configured to rotate about a point adjacent to the surface of the rotatable chip-receiving element.

* * * * *